(12) United States Patent
Velicu et al.

(10) Patent No.: US 7,820,971 B2
(45) Date of Patent: Oct. 26, 2010

(54) PHOTODETECTOR WITH DARK CURRENT REDUCTION

(75) Inventors: Silviu Velicu, Darien, IL (US); Christoph Grein, Wheaton, IL (US); Sir B. Rafol, South Pasadena, CA (US); Sivalingam Sivananthan, Naperville, IL (US)

(73) Assignee: EPIR Technologies, Inc., Bolingbrook, IL (US)

( * ) Notice: Subject to any disclaimer, the term of this patent is extended or adjusted under 35 U.S.C. 154(b) by 251 days.

(21) Appl. No.: 12/113,046

(22) Filed: Apr. 30, 2008

(65) Prior Publication Data
US 2009/0321642 A1 Dec. 31, 2009

(51) Int. Cl.
*H01L 31/11* (2006.01)
(52) U.S. Cl. .................................. 250/338.4
(58) Field of Classification Search ............. 250/338.4; 257/E31.018, E31.054, E31.068
See application file for complete search history.

(56) References Cited

U.S. PATENT DOCUMENTS

| | | | |
|---|---|---|---|
| 5,288,649 A | 2/1994 | Keenan | |
| 5,367,167 A | 11/1994 | Keenan | |
| 5,663,564 A * | 9/1997 | Radford | 250/338.4 |
| 6,236,045 B1 | 5/2001 | Rosencher et al. | |
| 6,310,346 B1 | 10/2001 | Boreman et al. | |
| 6,410,916 B1 | 6/2002 | Jost et al. | |
| 6,657,194 B2 | 12/2003 | Ashokan et al. | |
| 6,897,447 B2 | 5/2005 | Mitra | |
| 6,906,358 B2 | 6/2005 | Grein et al. | |
| 7,041,978 B2 * | 5/2006 | Gravrand et al. | 250/338.4 |
| 7,129,489 B2 | 10/2006 | Pham | |
| 7,135,698 B2 | 11/2006 | Mitra | |
| 7,217,982 B2 | 5/2007 | Taylor et al. | |
| 7,230,227 B2 | 6/2007 | Wilcken et al. | |
| 2007/0235758 A1 | 10/2007 | Klipstein | |

OTHER PUBLICATIONS

Bommena et al., "Uniformity studies of inductively coupled plasma etching in fabrication of HgCdTe detector arrays", Proc. SPIE vol. 6542, 65420J, May. 14, 2007, downloaded from http://spie.org.

J. Wenus et al., "Two-Dimensional Analysis of Double-Layer Heterojunction HgCdTe Photodiodes", IEEE Transactions of Electronic Development, vol. 48, No. 7, p. 1326 (2001).

(Continued)

*Primary Examiner*—Constantine Hannaher
(74) *Attorney, Agent, or Firm*—Jefferson Perkins; Momkus McCluskey, LLC

(57) ABSTRACT

A detector of incident infrared radiation has a first region with a first spectral response, and a second region with a second, different spectral response. The second absorption region is stacked on the first and may be separated therefrom by a region in which the chemical composition of the compound semiconductor is graded. Separate contacts are provided to the first and second absorption regions and a further common contact is provided so as to permit the application of either a bias voltage or a skimming voltage across the respective pn junctions. The detector may be operated such that a preselected one of the absorption regions responds to incident infrared radiation of a predetermined waveband while the other absorption region acts as a skimmer of dark current, thereby enhancing the signal to noise ratio of the detector.

13 Claims, 9 Drawing Sheets

OTHER PUBLICATIONS

G.N. Pultz et al., "Growth and characterization of P-on-nHgCdTe liquid-phase epitaxy heterojunction material for 11-18 um applications", Journal of Vacuum Science Technology, vol. B9 (3), p. 1724 (1991).

H. R. Vydyanath et al, "Observatiion of Prevalence of Quasi-Equilibrium in the MBE Growth of Hg1-XCdTe", Journal of Electronic Materials, vol. 27, No. 6, p. 507-509 (1998).

* cited by examiner

PHOTODETECTOR WITH DARK CURRENT REDUCTION

STATEMENT AS TO RIGHTS IN INVENTIONS MADE UNDER FEDERALLY-SPONSORED RESEARCH AND DEVELOPMENT

The present invention was made with governmental support under Contract No. NNL05AB06P awarded by the National Aeronautics and Space Administration. The government has certain rights in the present invention.

BACKGROUND OF THE INVENTION

Photodiodes are widely used for sensing light and infrared radiation. The signal-to-noise ratio which can be obtained from photodiodes is limited by the level of thermal noise, which in turn is related to the temperature of the component. The term "dark current" is commonly used in the art to define the current flowing in a photodiode during a totally dark condition. The signal-to-noise ratio in photodiodes is conventionally improved by cooling the component, usually down to a temperature which can be maintained by a liquid nitrogen coolant (77K). The means for cooling the photodiodes down to a low temperature and keeping them there are cumbersome and expensive. It accordingly has been a long-term objective to provide photodetectors which can operate closer to room temperature but at acceptable signal-to-noise ratios. The noisiness of a detector can be quantified by calculating its noise equivalent temperature difference, which is the minimum signal derived from the temperature difference between a target and its background that yields a signal-to-noise ratio of unity. Minimization of the NETD is desirable.

Detector cells conventionally accumulate charge in respective integration capacitors. A typical well depth for an integrating capacitor is about $10^7$ electrons. In infrared detector applications it will typically be filled by background radiation in about 1 ms. Large dark and radiation background currents more quickly saturate the integrating capacitor. If the dark and background current in such devices can be eliminated or reduced, their signal-to-noise ratios will be improved, and the NETDs will be reduced, permitting longer integration times. Further, the size and area of the integration capacitor can then be reduced, decreasing overall pixel size and increasing resolution of an array of such devices, and dynamic range can be enhanced.

SUMMARY OF THE INVENTION

According to one aspect of the invention, an infrared detector is constructed of at least five semiconductor layers. The first layer is highly doped to be of a first conductivity type (such as (n)). A second layer, formed on the first layer, is doped to be of the same conductivity type but at a lower concentration of dopant. This second layer acts as a first absorber region and has a first spectral response to incident radiation. A third layer, also of the first conductivity type, is formed on the second layer, and a portion of this is highly doped to be of a second conductivity type (such as (p)) and forms a contact portion and pn junction diode.

A fourth layer is formed on the opposite side of the third layer from the second layer, and to be of the first conductivity type. This fourth layer has a second spectral response which is different from the first spectral response; it is sensitive to a different spectral band which may however have some overlap with the first spectral band. A fifth layer is formed on the fourth layer and is highly doped to be of the second conductivity type. The fifth layer is used as a second contact portion spaced from the first contact portion. The fifth and fourth layer form a second pn junction diode spaced from the first pn junction diode. The detector may be operated by using one of the pn junctions as a radiation detector, and the other as a dark current skimmer, with the application of appropriate sensing and skimming voltages on the contacts.

In another aspect of the invention, a two-waveband radiation detector is provided which has a first absorber layer, adapted to sense a first waveband of incident radiation, and a second absorber layer, adapted to sense a second waveband of incident radiation. The first and second absorber layers are in semiconductive communication with each other and are formed to be of the first conductivity type. Contact regions are formed to be of a second conductivity type opposite that of the first conductivity type. A first of these is formed adjacent the first absorber layer, while a second of these is formed adjacent the second absorber layer. Each contact region and an adjacent absorber layer therefore form a respective pn junction. The second contact region is spaced from the first absorber layer. A common contact is in semiconductive communication with both the first and second absorber layers. Circuitry is provided to impress a predetermined sensing bias voltage across a preselected one of the first and second pn junctions, while a predetermined skimming voltage is impressed across the other pn junction. The predetermined skimming voltage creates a skimming current which will at least partially reduce a dark current component of a readout current read at the common contact, and may remove current generated background radiation as well.

Because the dark current component of the readout current is reduced or eliminated, the detector has an enhanced signal to noise ratio, and may permit longer integration times and/or smaller integration capacitors, all of which are technical advantages over prior art devices.

BRIEF DESCRIPTION OF THE DRAWINGS

Further aspects of the invention and their advantages can be discerned in the following detailed description, in which like characters denote like parts and in which.

DETAILED DESCRIPTION

Figure 1:
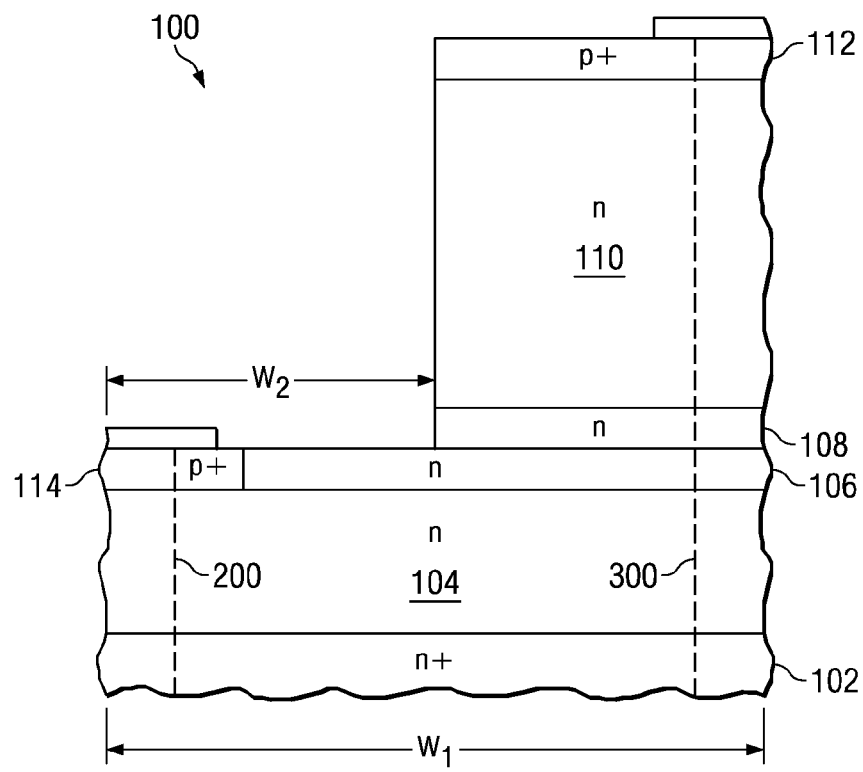
FIG. 1 is a highly magnified schematic sectional view of a photodetector cell according to the invention.

FIG. 1 is a highly magnified schematic sectional view of a two-color/skimming back-illuminated photodetector cell 100 according to a first embodiment of the invention. This illustrated embodiment is fabricated of an $Hg_{1-x}Cd_xTe$ compound semiconductor (0<x<1; commonly called MCT for mercury cadmium telluride), suitable for detecting radiation in long wave infrared (LWIR) and medium wave infrared (MWIR) bands or colors. The invention has application to other Group II-VI chemistries, to other compound semiconductor detector devices and to radiation detectors generally.

The cell 100 may be fabricated by successively growing, on a CdTe/Si substrate, HgCdTe layers which are doped differently from each other and/or have different ratios of mercury to cadmium, and then selectively etching back some of these. In particular, an (n) contact layer 102, MWIR absorber layer 104, layer 106, gradient layer 108, LWIR absorber layer 110 and LWIR (p) contact layer 112 are successively formed on top of each other, preferably using a molecular beam epitaxy (MBE) technique. Regions or layers 102 and 104, most of region or layer 106, region or layer 108 and region or layer 110 are doped in situ to be n-type as by the use of an Indium dopant. A MWIR contact region 114 and LWIR contact region 112 are doped to be p-type as by use of an Arsenic implant. Representative thicknesses, semiconductor compositions and dopant concentrations of these layers are presented in the following Table I. Variable x is the relative concentration of cadmium in the mercury-cadmium-telluride (MCT) compound semiconductor $Hg_{1-x}Cd_xTe$:

TABLE I

| Region | Thickness | Composition, x | Dopant Concentration, cm⁻³ |
| --- | --- | --- | --- |
| 112 | 1 μm | 0.30 | $N_A = 1 \times 10^{17}$ |
| 110 | 3 μm | 0.20 | $N_D = 1 \times 10^{15}$ |
| Gradient (108) | 1 μm | 0.20-0.35 | $N_D = 1 \times 10^{15}$ |
| 106 | 1 μm | 0.35 | $N_D = 1 \times 10^{15}$ |
| 104 | 4 μm | 0.30 | $N_D = 1 \times 10^{15}$ |
| 102 | 1 μm | 0.40 | $N_D = 1 \times 10^{17}$ |

The (p+) regions 112 and 114 can be formed by ion implantation and activation annealing. The MWIR contact region 114 can also have a dopant concentration NA of about $1 \times 10^{17}$ cm⁻³.

Region 102 is a wide band-gap buffer layer between the active device and the substrate. Region 104 functions as the MWIR absorber layer with a cutoff wavelength $\lambda_c$ of about 5.1 μm at 77K. Region 106 is a wide band-gap layer between the MWIR and LWIR absorber regions. Region 108 is a gradient layer in which the chemical composition of the compound semiconductor is gradually altered as a function of distance from region 106. Region 110 functions as the LWIR absorber layer with a cutoff wavelength wavelength $\lambda_c$ of about 14.5 μm at 77K. Region 112 is a wide band-gap top window or contact region for the LWIR detector. A portion of the stack of layers 108-112 is patterned and etched to create the stepped semiconductor shown. This etch may be done by an inductively coupled plasma (ICP) etch process using Argon and methane. A (p+) MWIR contact region 114 is formed in layer 106.

The cell 100 shown in FIG. 1 has a smaller (in terms of volume and area) LWIR device to create larger resistance, and a larger MWIR device to accommodate low photon flux. A width $w_1$ and pixel size of the cell 100 can be about 30 μm, while a width w2 of the etched portion of the structure can be about 10 μm.

Figure 2:
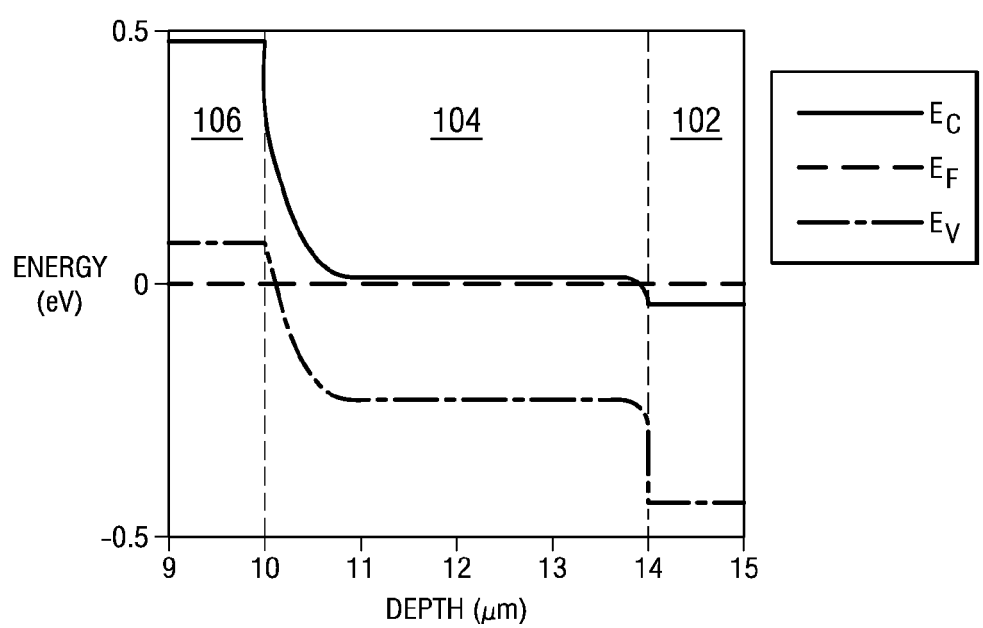
FIG. 2 is a band diagram for a medium wavelength infrared (MWIR) detector region of the cell illustrated in FIG. 1.
Figure 3:
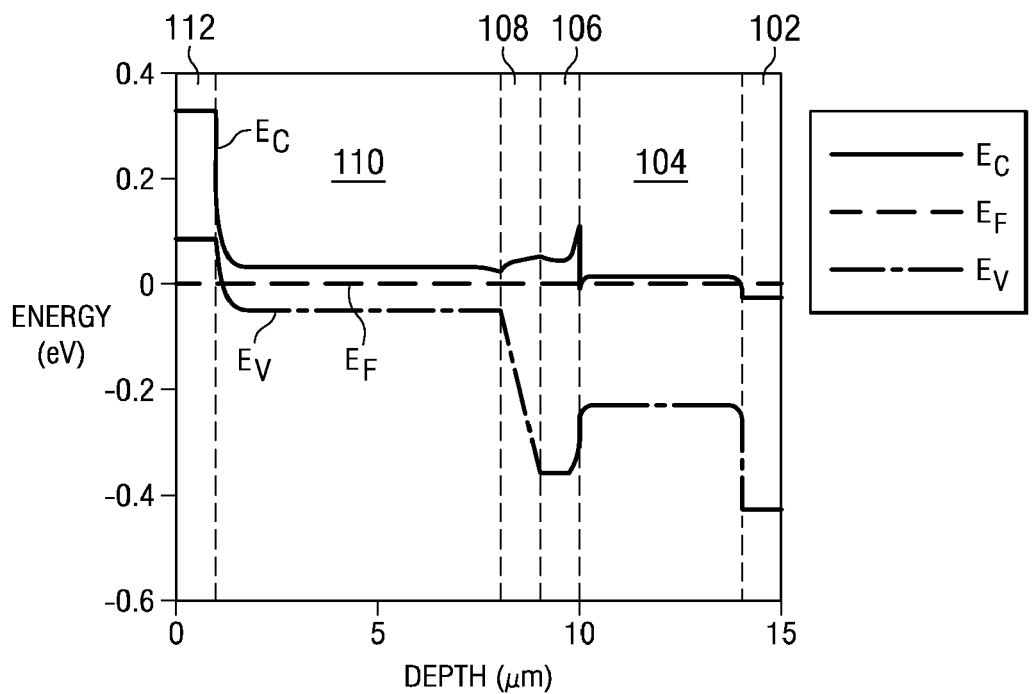
FIG. 3 is a band diagram for a long wavelength infrared (LWIR) detector region and an n-type Medium Wavelength Infrared (MWIR) detector region of the cell illustrated in FIG. 1.

FIG. 2 is a band diagram of a leftmost portion 200 of the cell 100, mostly involved with the function of the cell 100 as a MWIR detector, while FIG. 3 is a band diagram of a rightmost portion 300 of the cell 100, also involved as an LWIR detector. Areas on these graphs have been identified with the character identifying the semiconductor region to which they correspond. Note the barrier interposed by regions 106 and 108 between the MWIR absorber layer 104 and the LWIR absorber layer 110.

Figure 4:
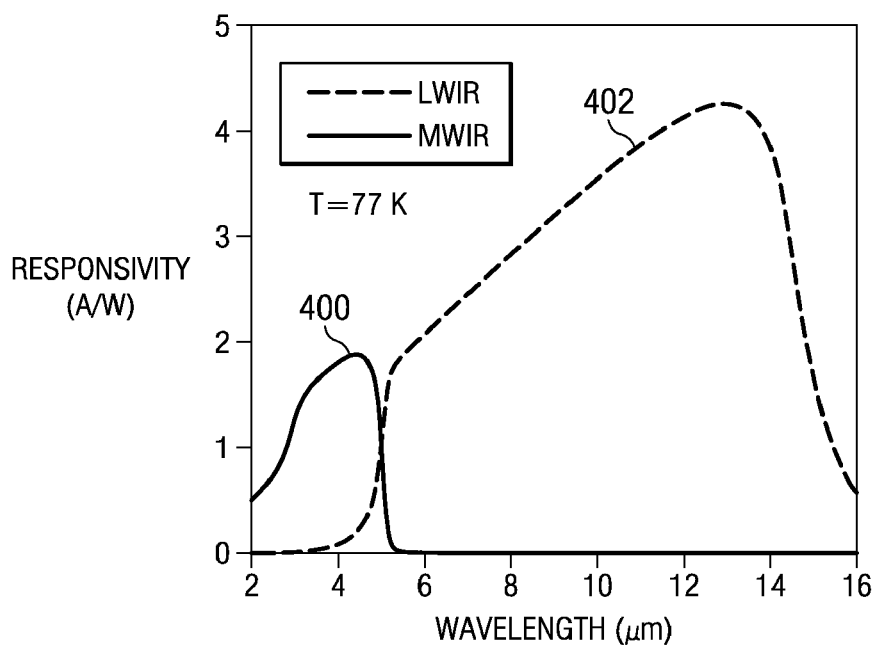
FIG. 4 is a graph of responsivity versus wavelength for the LWIR and MWIR detectors in the cell of FIG. 1.

FIG. 4 shows a graph of the responsivity (A/W) of this cell at 77 K. Profile 400 is for the MWIR region. Profile 402 is for the LWIR region. There is a relatively small amount of spectral cross-talk as shown by the overlap of the two graphs. When measured as the ratio of the area of the cross-over region to the signal integrated over the entire spectral domain, the cross-talk of the LWIR region as contributed to sensing LWIR wavelengths is about 4.5%, while the cross-talk of the MWIR region as contributing to sensing MWIR wavelengths is about 2.0%.

Figure 5:
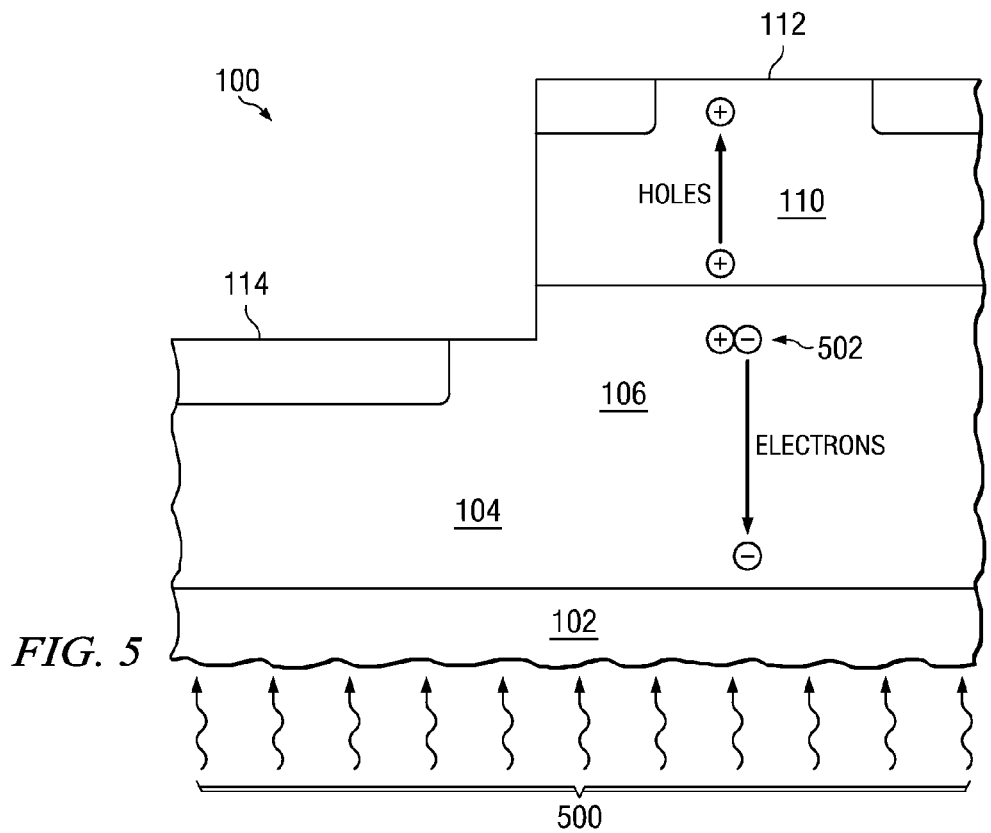
FIG. 5 is a diagram, based on FIG. 1, showing the movement of generated electron-hole pairs under LWIR illumination with in substantial or no bias voltage applied to a MWIR contact.

Cell 100 may be operated alternatively as an MWIR or as a LWIR device, depending on the voltages impressed on its contacts. FIG. 5 illustrates LWIR operation under LWIR illumination. No substantial reverse bias is applied to MWIR contact 114. A depletion region can extend into the LWIR absorber region 110 if the junction between (p+) contact region 114 and (n) LWIR absorber region 104 is placed sufficiently close, such as in the range of one to five microns, to the LWIR absorber region 110. When LWIR radiation 500 enters the LWIR absorber region 110, electron-hole pairs 502 will be generated. The electrons will be pulled toward (n) contact 102 while the holes will mostly flow to the LWIR contact 112. But if a reverse bias is applied between contact 114 and the common contact 102, some of the holes will diffuse to the MWIR depletion region and are skimmed through the MWIR contact 114.

Figure 6:
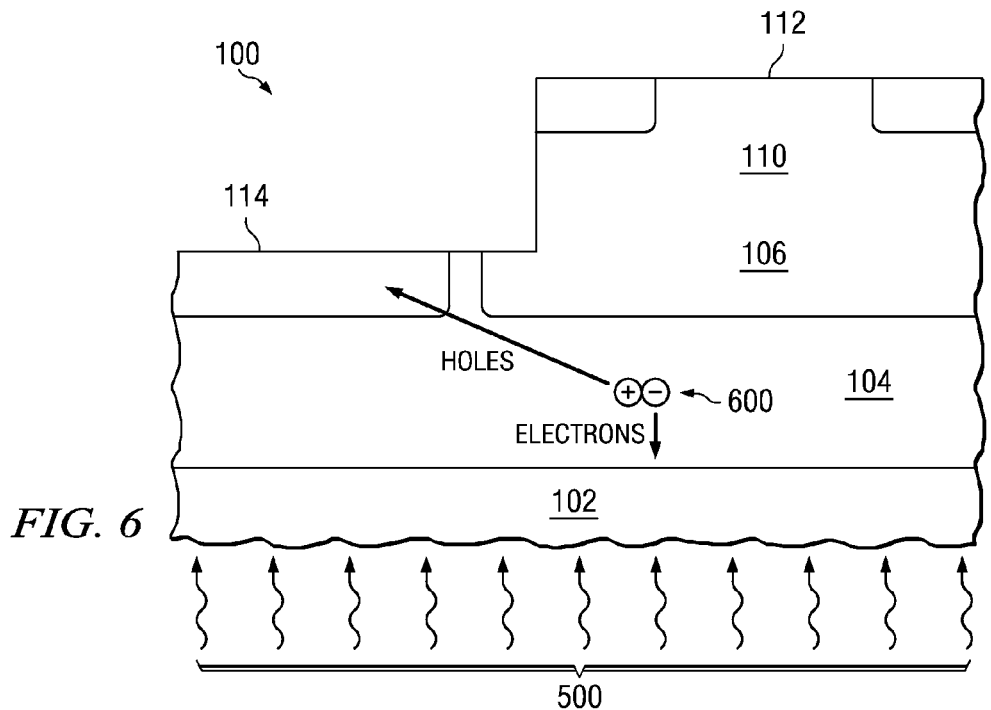
FIG. 6 is a diagram, based on FIG. 1, showing the movement of electron-hole pairs generated under MWIR illumination.
Figure 7:
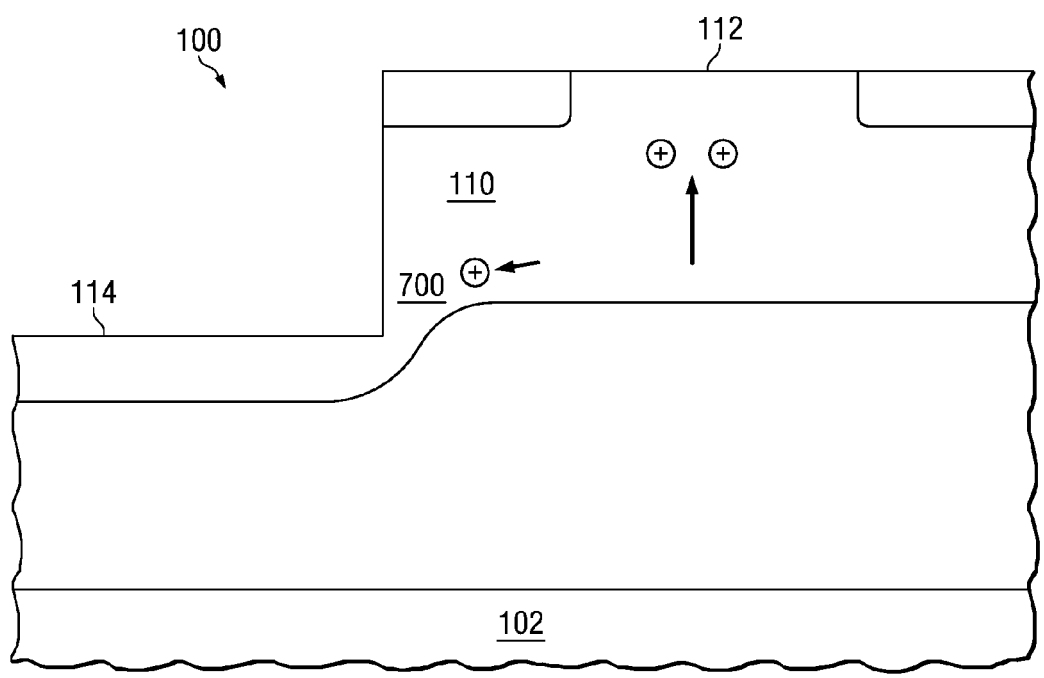
FIG. 7 is a view, taken after FIG. 1, showing the creation of a depletion region extending to a LWIR absorber region and resultant current skimming, under LWIR illumination and a negative bias voltage applied to the MWIR contact.

FIG. 7 shows operation of the cell under LWIR illumination and MWIR bias. MWIR depletion region 700 is extended from (p+) contact 114 to join the depletion region formed in the LWIR absorber region 110 in these conditions. A skimming bias voltage of −4V is applied to contact 114, while a sensing voltage of −0.1V is applied to contact 112. If the voltages are adjusted such that the holes collected at the MWIR contact 114 account for all or a portion of the dark current, the holes appearing at contact 112 will be more attributable to impinging LWIR radiation and less attributable to dark current, with the objective being to totally skim off all of the dark current to improve the device's signal to noise ratio. As shown by the graphs of FIGS. 8-11, the two-contact embodiment illustrated in FIGS. 1-7 is capable of skimming between five and ten percent of the LWIR current depending on the flux of the incident radiation.

FIG. 6 shows operation of this device 100 under MWIR illumination and as a MWIR detector. Here, electron-hole pairs 600 are formed in the MWIR absorber region 104. The holes are pulled toward MWIR contact 114 while the electrons are pulled toward contact 102. Contact 112 will skim off some of those holes.

Figure 8:
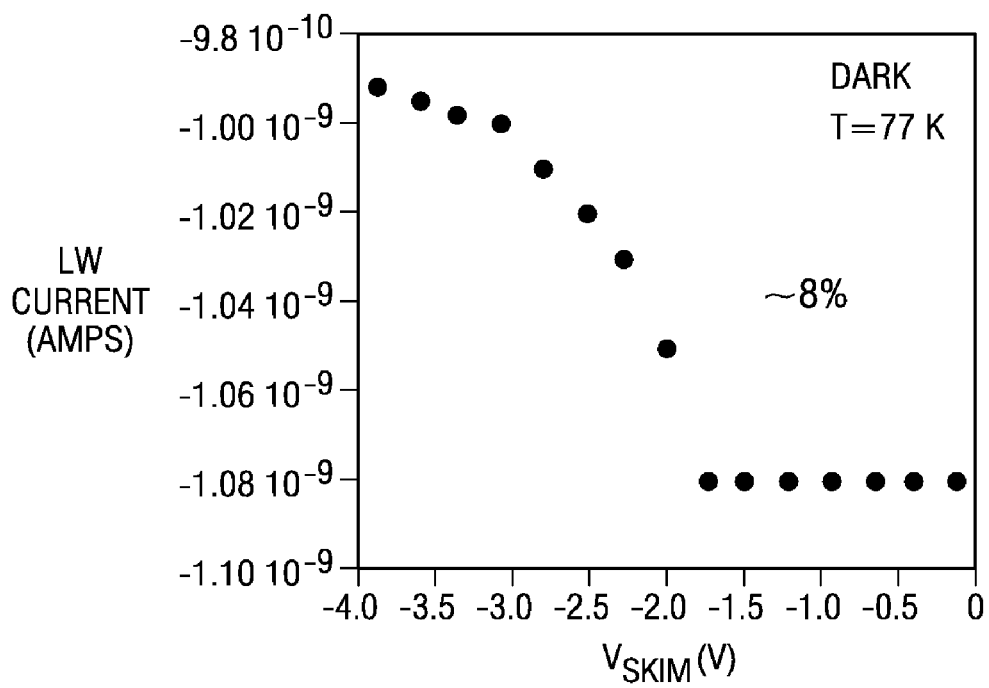
FIG. 8 is a graph, for the structure shown in FIG. 1, of LWIR current versus a skimming voltage applied at a MWIR contact, in dark conditions at 77K.
Figure 9:
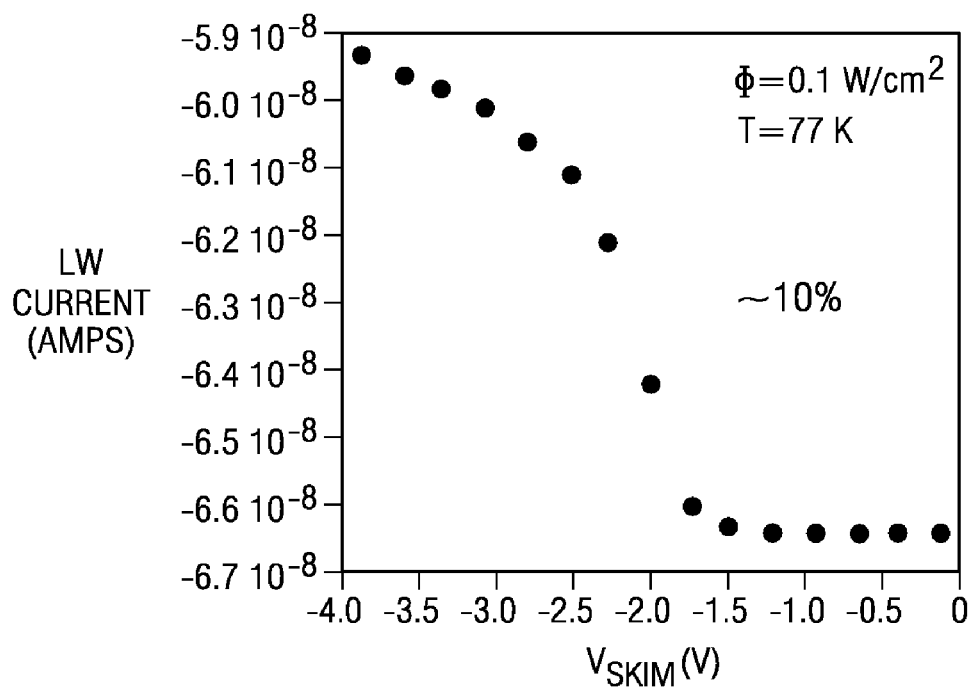
FIG. 9 is a graph similar to that shown in FIG. 8, but with an incident photon flux $\Phi=0.1$ W/cm$^2$.
Figure 10:
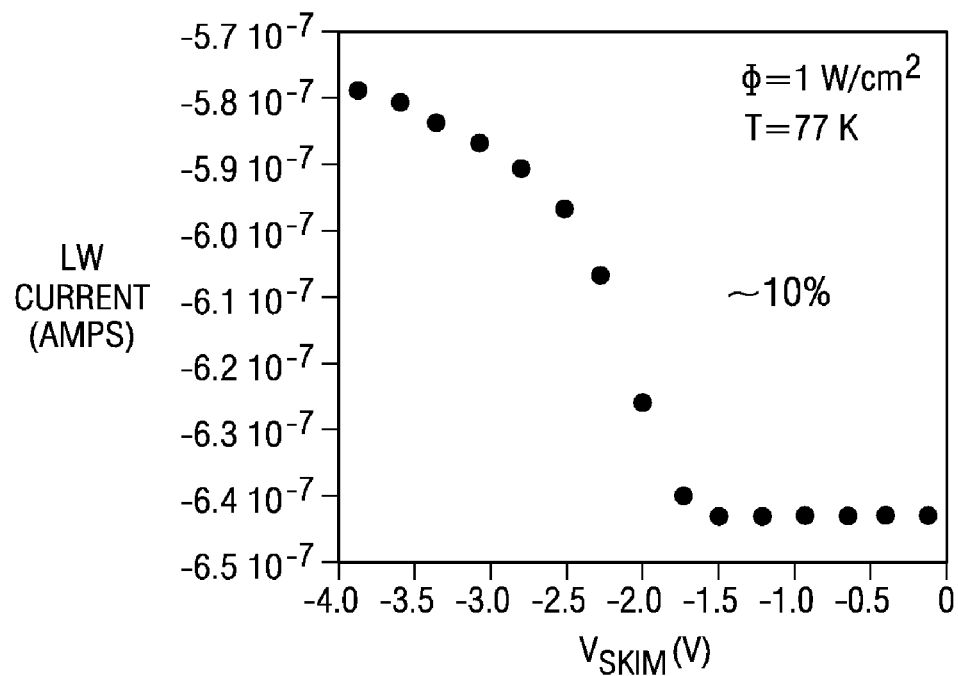
FIG. 10 is a graph similar to that shown in FIGS. 8 and 9, but with an incident photon flux Φ=1.0 W/cm².
Figure 11:
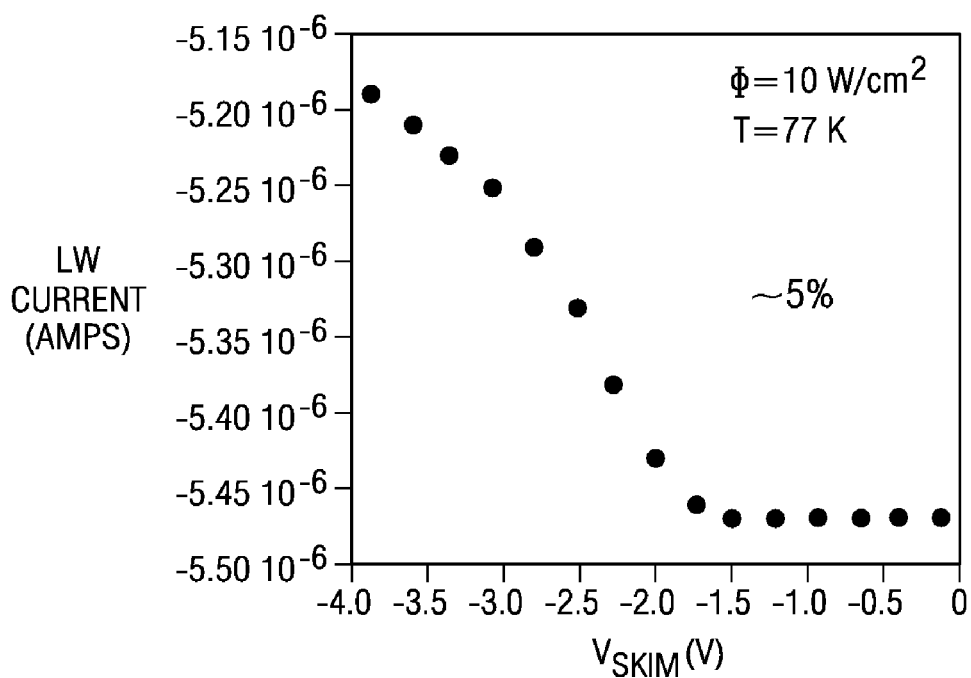
FIG. 11 is a graph similar to that shown in FIGS. 8-10, but with an incident photon flux Φ=10 W/cm².

FIGS. 8-11 are graphs of LWIR current versus a skimming bias voltage applied to MWIR contact 114 for the cell illustrated in FIG. 1. FIG. 8 shows a graph for dark conditions. FIG. 9 is a graph for an incident radiation flux Φ of 0.1 W/cm$^2$. FIGS. 10 and 11 are for a flux Φ of 1 W/cm$^2$ and 10 W/cm$^2$, respectively. The given percentages are of skimmed current corresponding to the ratio of the LWIR current at −4V skimming voltage to the LWIR current when no skimming voltage is applied. Under varying illumination conditions, this percentage is between five and ten percent.

Figure 12:
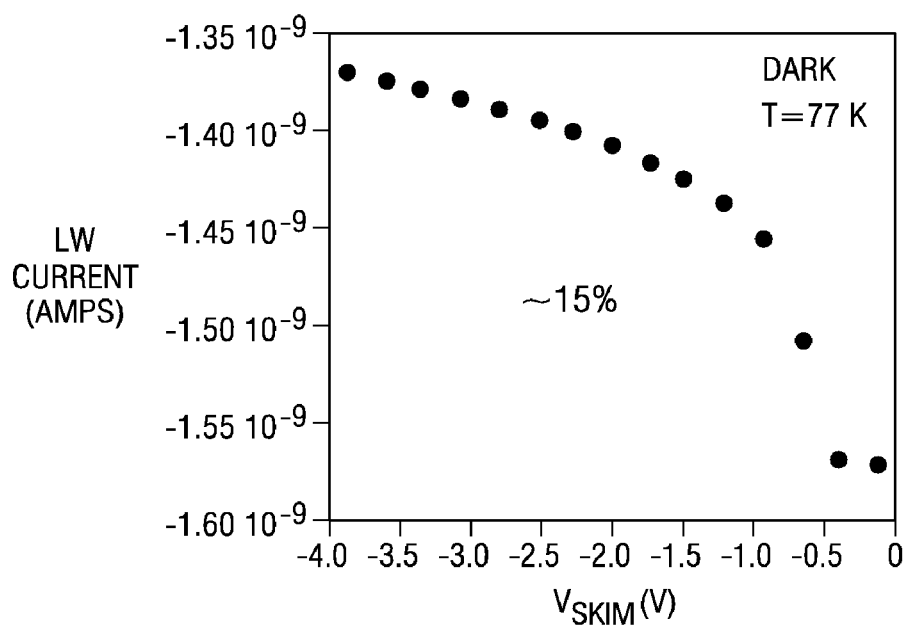
FIG. 12 is a graph of LWIR current v. skimming voltage applied to a MWIR contact region, where the structure in FIG. 1 has been altered.

In order to increase the percentage of skimmed current in a two-contact device, one can decrease the background (n) doping of MWIR depletion region 106 to 5×10$^{14}$ cm$^{-3}$ and change the molecular proportion x in the Hg$_{1-x}$Cd$_x$Te semiconductor in region 106 to 0.30. This decreases the barrier at the region 106/region 110 interface and increases the skimming current to about fifteen to twenty percent, as shown by FIG. 12.

Figure 13:
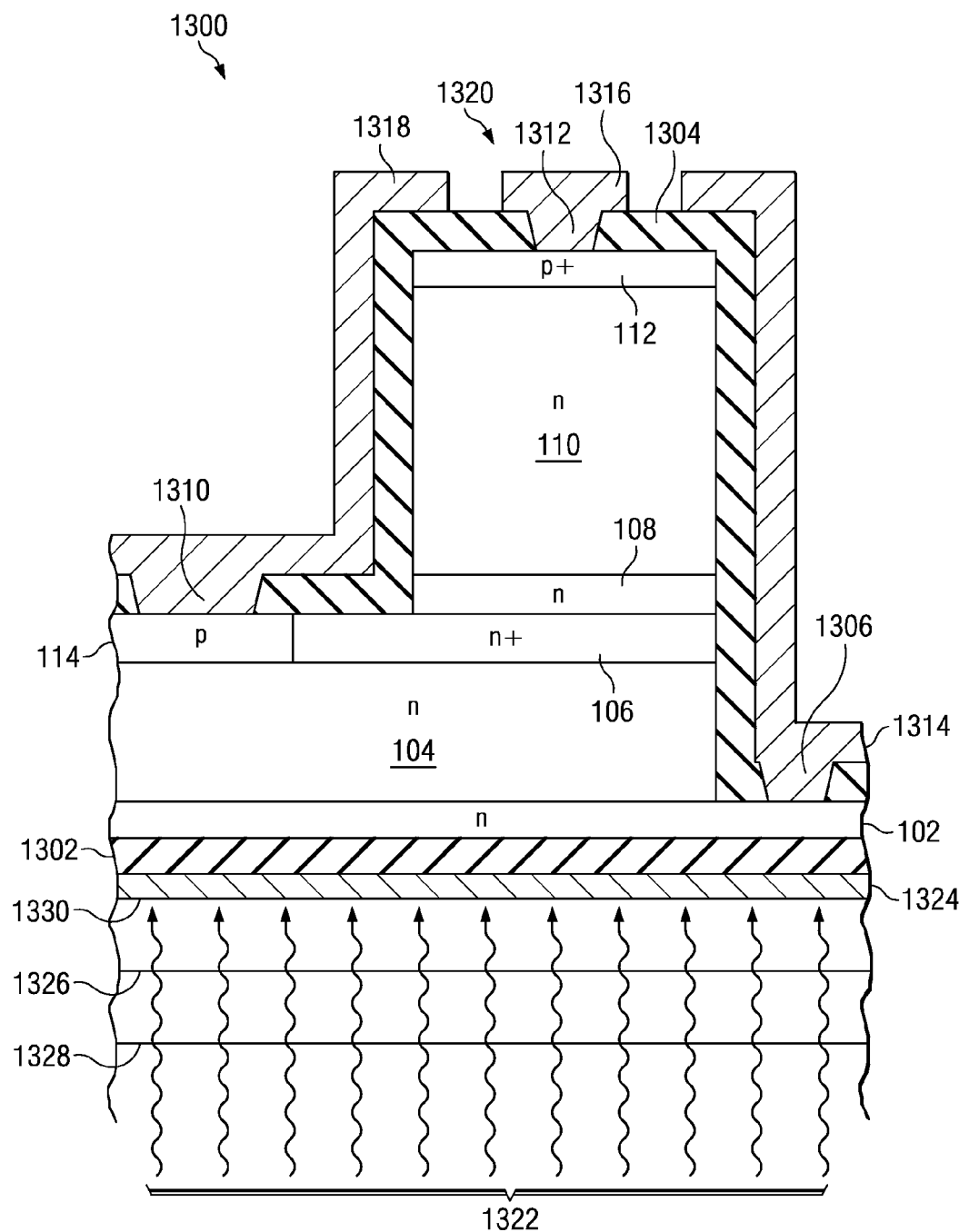
FIG. 13 is a highly schematic sectional view of a three-contact photodetector cell according to a second embodiment of the invention.

Another way to improve operation of this device is to use a three-contact-per-pixel architecture, as illustrated in the highly magnified schematic sectional view of FIG. 13. The semiconductor structure of this cell 1300 can be the same as that of the cell illustrated in FIG. 1. After the semiconductor structure of the cell 1300 is formed, the cell 1300 can be coated with a suitable passivation layer 1302 on its bottom side adjacent region 102, and a passivation layer 1304 on its top side adjacent regions 102-112. A contact 1306 is made to n-type region 102. A contact 1310 is made to the MWIR contact region 114. A contact 1312 is made to the LWIR contact region 112. Conductors 1314, 1316 and 1318 are then formed to connect these contacts to a top 1320 of the device, where connection can be made to an ROIC circuit and external leads through Indium bumps (not shown).

The cell 1300 typically will be one of many in a two-dimensional array and its bottom side is presented toward a source of infrared radiation 1322 to be detected. To increase detector efficiency an antireflective coating 1324 may be deposited on passivation layer 116. The illustrated cell 1300 is capable of single-color LWIR, single-color MWIR, and two-color modes, and in the first two of these a respective filter (one of those schematically represented at 1326, 1328) is superimposed over the bottom face 1330. The filters 1326, 1328 are either mechanically removable or their filtering characteristics are electronically controlled to permit passage of MWIR wavelengths, LWIR wavelengths or both.

Figure 14:
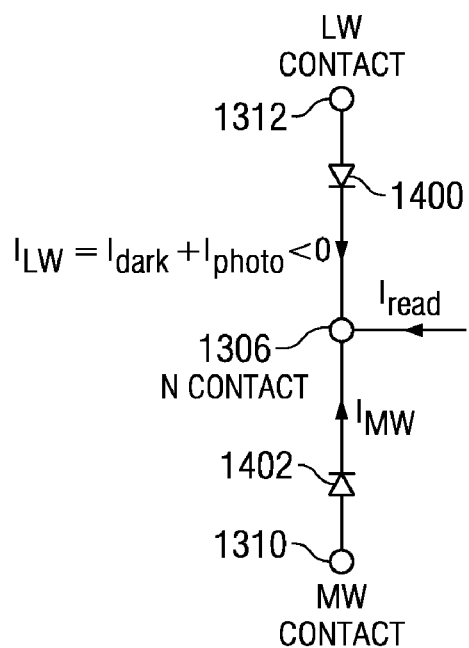
FIG. 14 is an equivalent circuit for the structure illustrated in FIG. 13, illustrating current skimming in this embodiment.

FIG. 14 is an equivalent circuit model of cell 1300. An anode of the LWIR detector diode 1400 is connected to the LW contact 1312, while the cathode thereof is connected to the (n) or common contact 1306. An anode of the MWIR detector diode 1402 is connected to the MW contact 1310, while the cathode thereof is connected to the (n) contact 1306. Using long-wavelength single-color operation as an example, the current I$_{LW}$ through diode 1400 will be the sum of the dark current I$_{dark}$ and photogenerated current I$_{photo}$, and will be negative. A skimming voltage V$_{skim}$ is applied to the MW contact 1310. This skimming voltage is so selected that a current I$_{MW}$ running through the MWIR detector diode 1402 will be equal to but of opposite sign from the dark current I$_{dark}$. The dark current is thereby cancelled out. The resultant readout current I$_{read}$ sensed at contact 1306 will then have no dark current component in it at all, completely removing this contribution to the signal to noise ratio.

Because of this current skimming, less current is available for integration, in turn permitting longer integration times and/or smaller integration capacitors.

Figure 15:
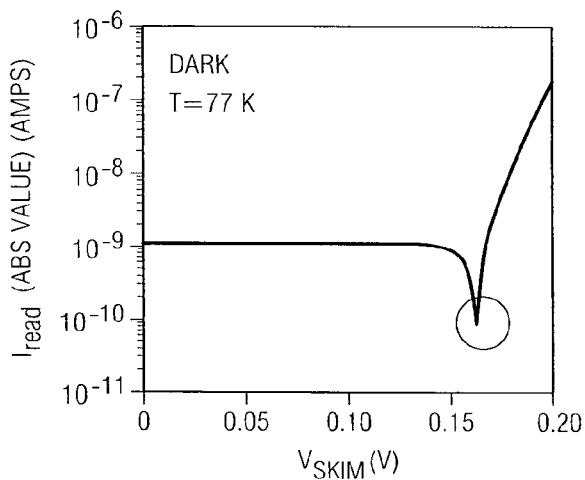
FIG. 15 is a graph of read current $I_{read}$ versus skimming voltage $V_{skim}$ for the photodetector shown in FIG. 13, in dark and at a temperature of 77K.
Figure 16:
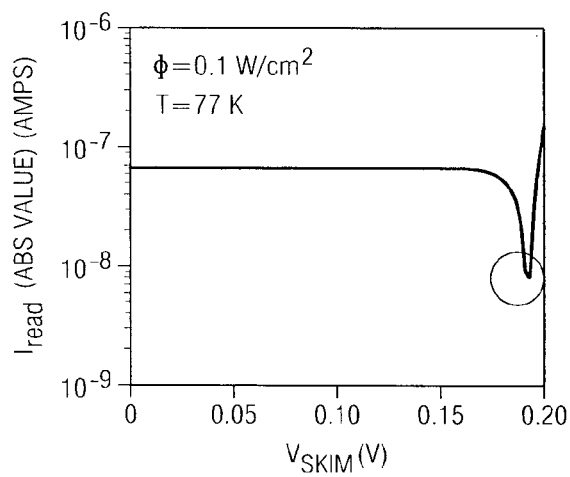
FIG. 16 is a graph similar to FIG. 15, but showing an $I_{read}$ v. $V_{skim}$ curve with incident IR radiation flux at 0.1 W/cm².

FIGS. 15 and 16 show the simulated operation of cell 1300. The graph of FIG. 15 is plotted for a temperature of 77K and in dark conditions. The readout current I$_{read}$ dips at a skimming voltage V$_{skim}$ (applied to the MW contact) of about 0.162 V. Since there is no photogenerated current I$_{photo}$ in these conditions, the objective is to minimize the total readout current. About ninety percent of the dark current is skimmed.

FIG. 16 is a similar graph in which the incident flux of infrared radiation is 0.1 W/cm$^2$. In these conditions, choosing a skimming voltage V$_{skim}$ of about 0.192 V will yield a maximum amount of skimmed dark and background current.

Figure 17:
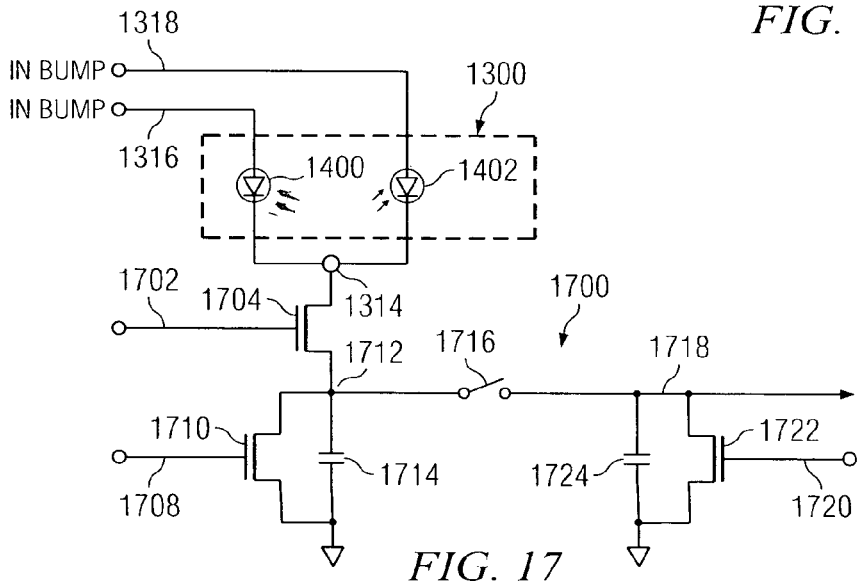
FIG. 17 is a schematic circuit diagram of the photodetector cell illustrated in FIG. 8 and a connected readout integrated circuit (ROIC) for operating the cell.

FIG. 17 is a schematic circuit diagram of cell 1300 as connected (as by Indium bumps) to related readout integrated circuit (ROIC) circuitry. The cell 1300 includes a MWIR detector/photodiode 1402 and an LWIR detector/photodiode 1400. A Det_Com_1 lead 1318 is connected to MWIR photodiode 1402 through contact 1310 (seen in FIG. 13). A Det_Com_2 lead 1316 is connected to LWIR photodiode 1400 through contact 1312. The other ends of photodiodes 1400, 1402 are connected in common to node 1314 (an Indium bump) via contact 1306.

The ROIC circuit 1700 making up the rest of the circuit shown in FIG. 17 is a direct injection amplifier. A bias adjust signal line 1702 is connected to the gate of a bias adjust transistor 1704, the current path of which connects node 1314 to a node 1706. An anti-blooming signal line 1708 is connected to the gate of a transistor 1710, the current path of which connects node 1712 to ground. The current path of transistor 1710 is parallel to an integration capacitor 1714. Node 1712 is connected via a transfer gate 1716 to a node 1718. A reset control line 1720 is connected to the gate of a transistor 1722, the current path of which connects node 1718 to ground. A S/H capacitor 1724 is in series with the current path of the transistor 1722. The node 1718 is coupled to a column amplifier (not shown).

The circuit shown in FIG. 17 may be operated in any of six different modes, as shown in the following table.

TABLE II

| MWIR | | LWIR | | Operating Color | Comment |
|---|---|---|---|---|---|
| Det_Com_1 (1318) | | Det_Com_2 (1316) | | | |
| With Filter | No Filter | With Filter | No Filter | | |
| | OFF | | | | Both colors off |
| | OFF | | ON | LWIR only | Single color |
| | ON | | OFF | MWIR only | Single color |
| | ON | | ON | LWIR and MWIR | Both colors |
| ON | | | ON | LWIR | MWIR used to skim |
| | ON | ON | | MWIR | LWIR used to skim |

In summary, a photodetector has been presented which has two photodiodes. The detector may be operated such that one of the photodiodes is used as the sensor and the other of the photodiodes is used to skim off a portion or all of the dark current of the device. The signal to noise ratio and utility of the device as a detector therefore show improvement over prior art devices.

While illustrated embodiments of the present invention have been described and illustrated in the appended drawings, the present invention is not limited thereto but only by the scope and spirit of the appended claims.

We claim:

1. A detector of incident radiation in the infrared region, comprising:
   a first semiconductor layer highly doped to be of a first conductivity type, a conductive common contact made to the first semiconductor layer;
   a second semiconductor layer formed on a face the first semiconductor layer and doped to be of the first conductivity type, the second semiconductor layer having a predetermined first spectral response with respect to the wavelength of incident radiation;
   a third semiconductor layer formed on the second semiconductor layer to be opposite the first semiconductor layer and doped to be of the first conductivity type, a contact portion of the third semiconductor layer highly doped to be of a second conductivity type opposite the first conductivity type, the third semiconductor layer having a first surface adjoining the second semiconductor layer and a second surface opposed to the first surface, said contact portion extending from the first surface to the second surface, a conductive first detector contact formed on the second surface of the third semiconductor layer within said contact portion;
   a fourth semiconductor layer having a first surface adjacent the second surface of the third semiconductor layer and a second surface opposed to the last said first surface, the fourth semiconductor layer formed to be of the first conductivity type and formed on a portion of the third semiconductor layer so as to spaced from the contact portion of the third semiconductor layer, the fourth semiconductor layer having a predetermined second spectral response with respect to the wavelength of incident radiation which is substantially different from the first spectral response; and
   a fifth semiconductor layer having a first surface adjacent the second surface of the fourth semiconductor layer and a second surface opposed the last said first surface, the fifth semiconductor layer formed to be of the second conductivity type, a conductive second detector contact formed on the second surface of the fifth semiconductor layer.

2. The detector of claim 1, wherein at least the third and fourth semiconductor layers are formed of a compound semiconductor, the third semiconductor having a first predetermined ratio of a first semiconductor constituent to a second semiconductor constituent, a first portion of the fourth semiconductor layer remote from the third semiconductor layer having a second predetermined ratio of the first semiconductor constituent to the second semiconductor constituent which is different from the first predetermined ratio, a second portion of the fourth semiconductor layer proximate the third semiconductor layer having a ratio of the first semiconductor constituent to the second semiconductor constituent which varies between said first predetermined ratio and the second predetermined ratio as a function of the distance from the third semiconductor layer.

3. The detector of claim 2, wherein the compound semiconductor forming the third and fourth semiconductor layers is a Group II-VI compound semiconductor.

4. The detector of claim 3, wherein the compound semiconductor has the formula $Hg_{1-x}Cd_xTe$, $0<x<1$.

5. The detector of claim 1, wherein a resistance of the second semiconductor layer is less than a resistance of the fourth semiconductor layer, and wherein an area of the second semiconductor layer presented to impinging radiation is greater than an area presented to impinging radiation of the fourth semiconductor layer.

6. A two-waveband radiation detector adaptable to skim current so as to reduce dark current, comprising:
   a first absorber layer formed of a semiconductor material to be of a first conductivity type and adapted to sense a first waveband of incident radiation;
   a second absorber layer formed of a semiconductor material to be of the first conductivity type and adapted to sense a second waveband of incident radiation which is different from the first waveband, the second absorber layer in semiconductive communication with the first absorber layer;
   a first contact region of semiconductor material formed to be of a second conductivity type opposite the first conductivity type, the first contact region forming a first pn junction with the first absorber layer and spaced from the second absorber layer;
   a second contact region of semiconductor material formed to be of the second conductivity type, the second contact region forming a second pn junction with the second absorber layer and spaced from the first absorber layer;
   a common contact in semiconductive communication with the first and second absorber layers;
   circuitry coupled to the first contact region, the second contact region and the common contact, the circuitry operable in a first mode for detecting the first waveband of radiation in which a first predetermined sensing bias voltage is impressed across the first pn junction, and a first predetermined skimming voltage is impressed across the second pn junction, the circuitry operable in a second mode for detecting the second waveband of radiation in which a second predetermined sensing bias voltage is impressed across the second pn junction and a second predetermined skimming voltage is impressed across the first pn junction, a readout current appearing at the common contact, the predetermined skimming voltage preselected to create a skimming current which will at least partially reduce a dark current component of the readout current.

7. The detector of claim 6, wherein the semiconductor material is a compound semiconductor.

8. The detector of claim 7, wherein the compound semiconductor is a Group II-VI compound semiconductor.

9. The detector of claim 8, wherein the compound semiconductor has the formula $Hg_{1-x}Cd_xTe$, $0<x<1$.

10. The detector of claim 7, wherein the elemental proportions of the compound semiconductor material used to form the first absorber layer are different from the elemental proportions of the semiconductor material used to form the second absorber layer.

11. The detector of claim 6, wherein a volume of the first absorber layer is substantially greater than a volume of the second absorber layer.

12. A process for detecting each of two colors of radiation, comprising the steps of:
   providing a detector cell with first and second spaced-apart pn junctions, a first absorber region adaptable to detect a first color of radiation disposed adjacent the first pn junction, and a second absorber region adaptable to detect a second color of radiation disposed adjacent the second pn junction;

detecting a first color of radiation, said step of detecting the first color of radiation including the substeps of:

applying a first predetermined bias voltage across the first pn junction and absorber region;

applying a first predetermined skimming voltage across the second pn junction and absorber region;

responsive to said step of applying the first predetermined skimming voltage, skimming at least a portion of a dark current from the first absorber region;

responsive to said step of skimming, removing at least a portion of the dark current from a readout current to thereby improve a signal to noise ratio of the cell while detecting the first color of radiation;

detecting a second color of radiation, said step of detecting the second color of radiation including the substeps of:

applying a second predetermined bias voltage across the second pn junction and absorber region;

applying a second predetermined skimming voltage across the first pn junction and absorber region;

responsive to said step of applying the second predetermined skimming voltage, skimming at least a portion of dark current from the second absorber region; and responsive to the last said step of skimming, removing at least a portion of the dark current from the readout current to thereby improve a signal to noise ratio of the cell while detecting the second color of radiation.

13. The process of claim 12, wherein responsive to said step of applying the first determined skimming voltage, a portion of background current as well as dark current is skimmed from the first absorber region.

* * * * *